United States Patent [19]

Clements et al.

[11] 4,373,606

[45] Feb. 15, 1983

[54] LOUDSPEAKER ENCLOSURE AND PROCESS FOR GENERATING SOUND RADIATION

[76] Inventors: Philip R. Clements, 8710-R, Park La., Dallas, Tex. 75231; Donald R. Smith, 4044 Buena Vista, #215, Dallas, Tex. 75204

[21] Appl. No.: 108,371

[22] Filed: Dec. 31, 1979

[51] Int. Cl.[3] ..................... H05K 5/00

[52] U.S. Cl. ..................... 181/151; 181/155; 181/156; 181/145; 181/146; 181/199; 181/296

[58] Field of Search ..................... 181/144-156, 181/199; 179/1 E

[56] References Cited

U.S. PATENT DOCUMENTS

| | | | |
|---|---|---|---|
| 2,766,839 | 10/1956 | Barush . | |
| 2,825,419 | 3/1958 | Stephens, Jr. . | |
| 2,978,060 | 4/1961 | Roberts . | |
| 2,986,229 | 5/1961 | Perkins, Jr. . | |
| 2,994,399 | 8/1961 | Zimmerman et al. . | |
| 3,047,090 | 7/1962 | Pruden . | |
| 3,412,824 | 11/1968 | Armstrong . | |
| 3,690,405 | 9/1972 | Hance . | |
| 3,952,159 | 4/1976 | Schott | 179/1 E |
| 4,128,738 | 12/1978 | Gallery | 179/1 E |
| 4,161,230 | 7/1979 | Ripple | 181/148 |
| 4,224,469 | 9/1980 | Karson | 179/1 E |

FOREIGN PATENT DOCUMENTS

| | | |
|---|---|---|
| 1024593 | 2/1958 | Fed. Rep. of Germany . |
| 2630547 | 1/1978 | Fed. Rep. of Germany . |
| 946134 | 5/1949 | France . |
| 496619 | 12/1938 | United Kingdom . |
| 663734 | 12/1951 | United Kingdom . |

OTHER PUBLICATIONS

"The Transmission-Line Loudspeaker Enclosure", Wireless World, May 1972.
"Loudspeaker Design", Audio, Feb. 1961.
"Reflex Enclosure", *Radio Electronics,* Nov. 1959.

*Primary Examiner*—Benjamin R. Fuller

[57] ABSTRACT

Both an improved loudspeaker enclosure and an improved acoustical process for generating sound radiation in a room is herein disclosed. Basically, the walls of the improved enclosure include a loudspeaker, and a sound transmission port for transmitting sound generated by the back of the loudspeaker cone into the room. The interior of the enclosure includes a tuned acoustical chamber for absorbing the even and odd harmonics of the system resonance frequency, and a compression chamber acoustically coupled at one end to the back of the loudspeaker cone. The compression chamber is acoustically coupled to both the tuned acoustical chamber and the transmission port of the enclosure walls by means of an acoustical coupling. When the transmission port is located in the back wall of the enclosure, the sound transmitted by the transmission port may be directed into and amplified by an acoustical structure formed by the back enclosure wall, the room floor, and the room walls, where it reflects and combines with the sound radiation generated by the front of the loudspeaker cone.

27 Claims, 26 Drawing Figures

FIG. 2a
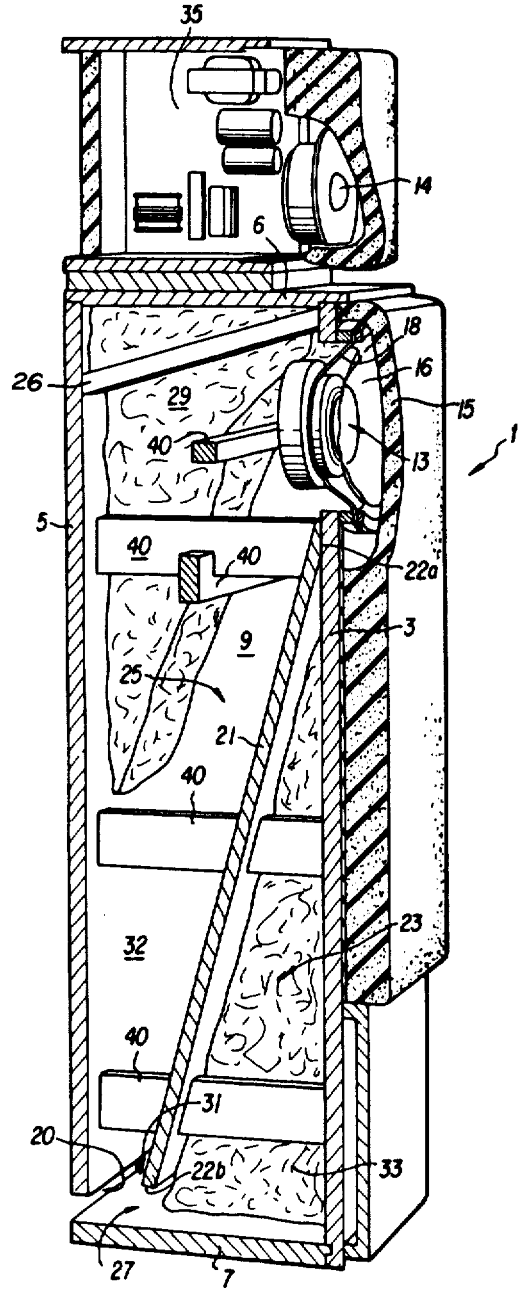
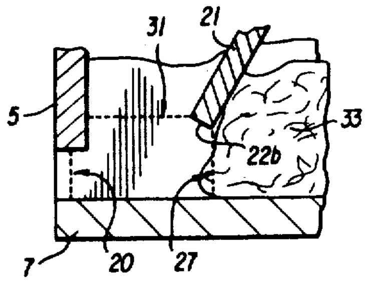
FIG. 2b

LOUDSPEAKER ENCLOSURE AND PROCESS FOR GENERATING SOUND RADIATION

BACKGROUND OF THE INVENTION

1. Field of the Invention

This invention relates to loudspeaker enclosures of the type typically classified in U.S. Patent Office Class 181.

2. Description of the Prior Art

Recent advances in semiconductor electronics have provided the consumer with a wide variety of moderately priced audio amplifiers capable of generating far more accurate audio signals than their predecessors of a decade ago. Unfortunately, this rapid growth in the electronic performance of audio amplifiers has not been paralleled by a rapid growth in the acoustical performance of audio loudspeaker enclosures. Thus the weakest link in the chain of audio reproduction is frequently the loudspeaker itself.

Ideally, a loudspeaker enclosure should possess four characteristics:

First, it should be capable of efficiently converting electrical power into acoustical power. Such conversion efficiency not only saves electrical energy, but helps minimize the amplitude distortions which can arise from the nonlinear characteristics of many audio amplifiers at their higher wattage outputs. Conversion efficiency also causes a speaker enclosure to be more responsive to the weaker audio signals generated by the amplifier, which extends the dynamic range of the enclosure. This extension of the dynamic range of the enclosure is particularly important since one of the shortcomings of reproduced music is its lack of dynamic range as compared to the range present in the original live performance.

Second, a loudspeaker enclosure should be capable of generating a broad range of sound frequencies. In otherwords, it should have the longest acoustical bandwidth possible so as to be capable of accurately reproducing all sounds present in the audible sound spectrum.

Third, a loudspeaker enclosure should be capable of generating all the sounds within its bandwidth with a minimum of amplitude and harmonic and intermodulation distortion.

Finally, it is very desirable from the consumer's point of view that the enclosure be compact in size and relatively inexpensive.

prior art attempts to construct the ideal loudspeaker enclosure generally fall into four categories. These categories include horn loaded speaker enclosures, ported bass reflex enclosures, infinite baffle enclosures, and hybrid design enclosures which combine the principal features of two or more of the first three categories named. Unfortunately, none of the enclosures in these categories possess all four "ideal" characteristics. Rather, each of the enclosures in these categories obtains one or more of the "ideal" characteristics only by a trade off of one or more of the others.

Horn loaded speaker enclosures generally possess the first three characteristics to a high degree; i.e., they are the most efficient type of speaker known, typically having an electrical to acoustical conversion rate of between 18 and 25 percent. They are also capable of producing a broad range of frequencies with little distortion. Horn enclosures achieve these characteristics by acting as an acoustical transformer which effectively matches the high impedance at the cone of the speaker to the low impedance at the surrounding air. Structurally, this is achieved by coupling a vibrating diaphragm to the flare of a horn through a compression chamber.

However, in order to have any kind of bass bandwidth, the flare of the horn must be quite large. For example, the system disclosed in the article entitled "Horn-loading Loudspeaker Enclosure" by Plach and Williams and appearing in the May, 1952, issue of Radio and Television requires a five foot by three foot by two foot cabinet and a fifteen inch woofer to effectively produce bass frequencies of approximately 40 cycles per second. Thus efficiency, long bandwidth, and lack of distortion are achieved by trading off compact cabinet size and cost.

To solve the problem of large size, numerous structures have been devised to "fold" acoustical horns, or to utilize the room floors and walls as extensions of the horn flare in order to reduce the size of the speaker cabinet. Prior art examples of folded horns appear in U.S. Pat. Nos. 4,161,230, 3,047,090, and 2,986,220; prior art examples of horn structures using the floor and walls of a room as horn flare extensions appear in U.S. Pat. Nos. 2,994,399 and 2,825,419.

Despite these attempts, state of the art horn loaded speakers still remain relatively large, cumbersome and expensive.

By contrast, ported bass reflex enclosures need not be overly large to effectively generate sound within a broad bass bandwidth. For example, the system disclosed in U.S. Pat. No. 3,952,159 is only 18.5 inches high, 14.5 inches wide and 9.5 inches deep, and yet has an effectively flat response curve starting at about 45 cps.

Ported bass reflex enclosures are also capable of possessing the other two "ideal" characteristics of efficiency and lack of distortion to a fairly high degree. The most common type of reflex enclosure is a system which generally comprises a loudspeaker enclosure having a loudspeaker and an air duct mounted on its front face. The bass reflex typically achieves a 2 to 6 percent conversion efficiency by transmitting the back wave generated by the back of the cone surface out of the air duct in its front face in phase with the front wave generated by the front of the cone surface. Additionally, the air load placed on the back surface of the speaker cone helps to moderately reduce harmonic distortion caused by cone excursion "overhang," as well as to extend the effective bass bandwidth of the unit.

However, despite the fact that the air load on the back of the speaker cone helps reduce "overhang" harmonic distortion, the sound generated by standard bass reflex designs is often accompanied by a great deal of amplitude and other harmonic distortion due to system resonance. This high distortion characteristic caused early bass reflex systems to be nicknamed "boom boxes," characterized by "one note" bass. Thus, moderate efficiency, long bandwidth, and compact size are achieved by trading off distortionless reproduction.

Some state of the art bass reflexes attempt to reduce this distortion by placing a lot of sound absorbing baffling material along the walls of the cabinet; others attempt to reduce distortion by placing a tuned acoustical chamber into the interior of the speaker cabinet to absorb the excess sound radiation generated at the resonant frequencies of the system. Examples of such systems occur in U.S. Pat. Nos. 4,128,738 and 2,766,839, respectively. Unfortunately, efficiency suffers from the introduction of baffling material or tuned acoustical chambers into the interior of a reflex system. Hence no ideal solution to the distortion problem present in typical ported bass reflex enclosures has yet been found by the prior art.

Infinite baffle enclosures, like compression line enclosures, also possess the characteristic of being relatively compact. Additionally a well designed infinite baffle speaker will have very little harmonic distortion caused by cone "overhang" excursion, as well as a fairly long bandwidth due to the air load placed on its back surface. However, the infinite baffle speaker is grossly inefficient due to the fact that the rear wave generated by the back cone surface is entirely absorbed, and usually converts less than one-half to two percent of the electric energy it receives into sound energy. This means that more electronic amplification is necessary to produce the same amount of sound energy, which can introduce amplitude distortion due to the frequently nonlinear characteristics of audio amplifiers at high power outputs. Hence, the infinite baffle type enclosure achieves compactness, fair bandwidth capacity, and moderately low harmonic distortion by trading off efficiency, which in turn frequently reduces its capacity to produce a broad range of sound frequencies without amplitude distortion and substantially reduces the speaker's ability to achieve dynamic range.

Hybrid speaker enclosures often possess all of the four "ideal" enclosure characteristics, but only to a limited extent. For example, the speaker enclosure disclosed in U.S. Pat. No. 2,978,060 comprises a loudspeaker mounted at an angle in an open, elongated cabinet, and is described as having " . . . certain properties (a) of a horn, [and] (b) of a Hemholtz resonator or bass reflex enclosure, . . . " (col. 3, lines 15 and 16). However, this particular system also has some of the limitations associated with each, including amplitude distortion from system resonance (see Graph D, FIG. 4).

Perhaps the hybrid speaker enclosure most pertinent to the instant invention is the inventor's old Model R enclosure which is part of the prior art. The old Model R speaker enclosure comprised a rectangular cabinet 26 inches high by 13 inches wide by 12½ inches deep which included an eight inch woofer having a back piston radiating area of 28 square inches. The woofer was acoustically mounted on the upper portion of the front enclosure wall. The old Model R enclosure also included a partitioning means diagonally extending from just under the woofer to within 1½" from the inside surface of the back wall of the enclosure, and 1½" from the inside surface of the bottom wall of the enclosure. This partitioning means divided the interior of the enclosure into a tuned acoustical chamber having a triangular cross section and an elongated tapered compression chamber.

The tuned acoustical chamber was defined between the lower face of the partitioning means, the side walls of the enclosure, and the inside surfaces of the front and bottom walls of the enclosure. A sound radiation entrance port was defined between the lower edge of the partitioning means and the inside surface of the bottom enclosure wall. The sound radiation entrance port had a cross sectional area of 21.56 square inches. The tuned acoustical chamber was filled with four pieces of Owens Corning RA26, 3" fiberglass baffling material.

The tapered compression chamber was defined between the upper surface of the partitioning means, the side walls of the enclosure, the top wall of the enclosure, and the back enclosure wall. The tapered compression chamber terminated in a throat defined between the lower edge of the partitioning means, and the inside surface of the back wall. Like the entrance port of the tuned acoustical chamber, the throat had a cross sectional area of 21.56 square inches. Further, the rear portion of the compression chamber directly behind the woofer was tuned with baffling material.

Finally, the old Model R had a rear transmission port defined by a gap between the rear enclosure wall and the bottom enclosure wall. This rear transmission port had a cross sectional area of 19.43 square inches. Thus the transmission port of the old Model R was 69 percent as large as the rear piston radiating area of the woofer.

In operation, the compression chamber in the old Model R speaker performed three functions. First, the air mass in compression chamber placed an air load on the back pistion radiating area of the woofer cone which helped reduce harmonic distortion due to speaker cone "overhang" excursion. Second, the chamber throat also served to load the woofer by virtue of the fact that the chamber throat was 23% smaller than the rear piston radiating area of the woofer. Finally, the tapered shape of the compression chamber served to focus or concentrate the entire vibrating column of air generated by the woofer toward the throat area at the end of the taper.

After traveling through the tapered end of the compression chamber, the pulsating air column next entered an acoustical coupling comprising a T intersection formed on top by the compression chamber throat, on one side by the back wall transmission port, on the other side by the acoustical chamber entrance port, and along its bottom side by the bottom enclosure wall. Here, the sound from the vibrating column was split between the entrance port of the acoustical chamber and the back wall transmission port.

Thus an acoustical transmission line was formed between the back piston radiating area of the speaker cone, the compression chamber, and the back enclosure wall transmission port. When the rear wall of the enclosure was placed a foot or so from one of the room walls, this transmission line was extended along the floor of the room by an acoustical structure formed by the back enclosure wall, the floor, and the room wall. The sound transmitted from the port bounced off the wall and reinforced the sound radiation generated by the front surface of the speaker cone.

The previously defined acoustical transmission line was acoustically coupled to the tuned acoustical chamber at the T intersection between the compression chamber throat, the back enclosure wall transmission port, and the acoustical chamber entrance port. The tuned acoustical chamber functioned to absorb most of the even and odd harmonics of the fundamental of the system resonance frequency.

The old Model R speaker enclosure contained only 1.75 cubic feet of volume, yet was capable of converting up to 8 percent of the electrical energy it received into acoustical energy. Additionally, the old Model R had a very broad bandwidth (extending as low as 41.2 cps) as well as a fairly flat frequency response curve. This is illustrated in FIGS. 5 and 7 a, b, c, d and e. Unfortunately some system resonance remained to audibly distort the sound generated by this enclosure.

SUMMARY OF THE INVENTION

The improved enclosure eliminates most all of the distortion present in the sound generated by the old Model R at no expense to cabinet size. The improved enclosure also provides a longer bandwidth as well as a higher efficiency rate than the old Model R.

Generally, the invention relates to an improved speaker enclosure capable of converting up to 10 percent of the electrical energy it receives into a broad bandwidth of sound extending down to 41.2 cps with little or no audible distortion. Like the old Model R, the walls of the improved speaker enclosure include a loudspeaker and a sound radiation port for transmitting sound generated by the rear piston radiating area of the woofer cone. Further, the interior of the enclosure also includes, a tuned acoustical chamber for absorbing the even and odd harmonics of the system resonance frequency, and a tapered compression chamber acoustically coupled at one end to the rear piston radiating area of the loudspeaker cone.

Unlike the old Model R, the improved loudspeaker enclosure includes an improved, distortion reducing acoustical coupling structure between the compression chamber, the transmission port, and the tuned acoustical chamber, wherein the cross sectional area of the transmission port is less than .65x and more than .30x, where x represents the rear piston radiating area of the woofer cone. The acoustical coupling may either be a T-shaped coupling formed on its top by the compression chamber throat, on its bottom by the bottom wall of the enclosure, and on its sides by an entrance port to the tuned acoustical chamber and a rear transmission port, respectively, or the coupling may be L shaped, formed on its top by a compression chamber throat, an entrance port to the tuned acoustical chamber, and a bottom wall of the tuned acoustical chamber, on its bottom by the bottom enclosure wall, and on its sides by the rear enclosure wall, and a front wall transmission port, respectively. The reduction of the cross sectional area of the transmission port not only reduces distortion, but also improves acoustical gain from the speaker unit, and hence efficiency. This reduction of the transmission port area also helps to prevent the speaker cone from over excursion which could damage it.

The loudspeaker enclosure of the invention is capable of generating sound out of a cabinet the same volume as the old Model R with less than one third of the distortion; furthermore the cabinet volume may be reduced from 1.75 cubic feet to 0.5 cubic feet with only a small trade off in efficiency and ability to produce essentially distortionless sound. Additionally, a substantial increase in efficiency and bandwidth and ability to generate distortionless sound may be accomplished with only a small trade off in increased cabinet volume.

Additionally, the improved enclosure may include a sound radiation deflector plate for deflecting sound generated by the back piston radiating area of the speaker cone away from the inner surface of the back wall and down toward the throat of the tapered compression chamber.

Moreover, the improved enclosure may include different amounts of baffling material in the tuned acoustical chamber and the rear of the compression chamber for both maximum absorption of the even and odd harmonics of the system resonance frequency, and maximum air movement within the enclosure, which in turn results in maximum signal output.

Finally, the invention also encompasses a process for generating sound radiation in combination with a room floor, or room floor and wall, or room corner which utilizes the improved, distortion reducing acoustical coupling of the enclosure of the invention.

BRIEF DESCRIPTION OF THE SEVERAL FIGURES

FIG. 1 is a cross-sectional, perspective view of one of the preferred embodiments of the invention;

FIG. 1*a* is a top, cross-sectional view of this embodiment,

FIG. 2*a* is a perspective, cross sectional view of another preferred embodiment of the enclosure of the invention, and FIG. 2*b* is an enlarged cross sectional view of the acoustical coupling used in this embodiment;

Figure 7A:
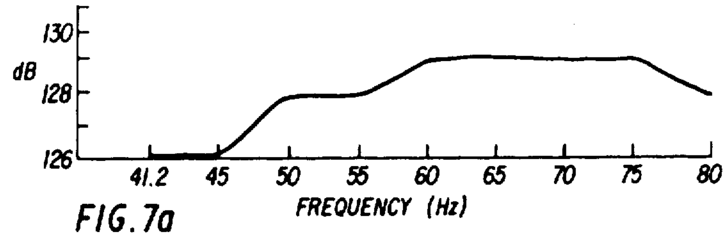
Figure 7B:
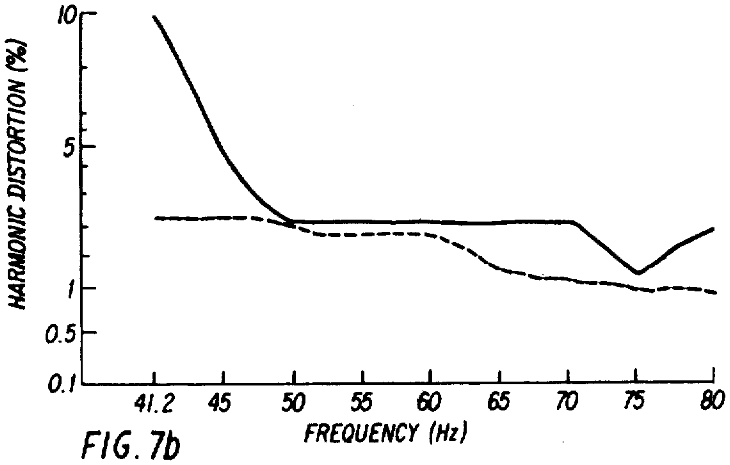
Figure 7C:
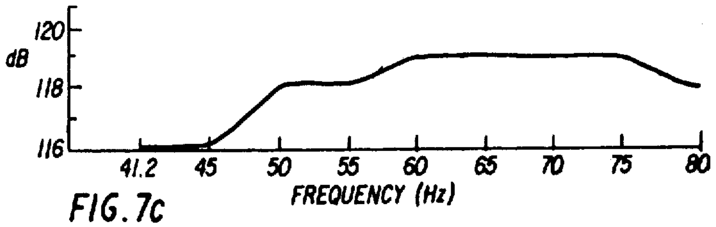
Figure 7D:
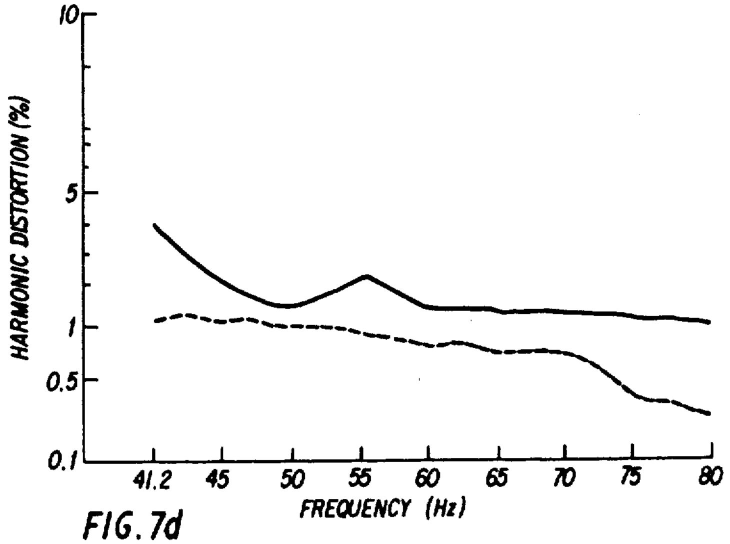
Figure 7E:
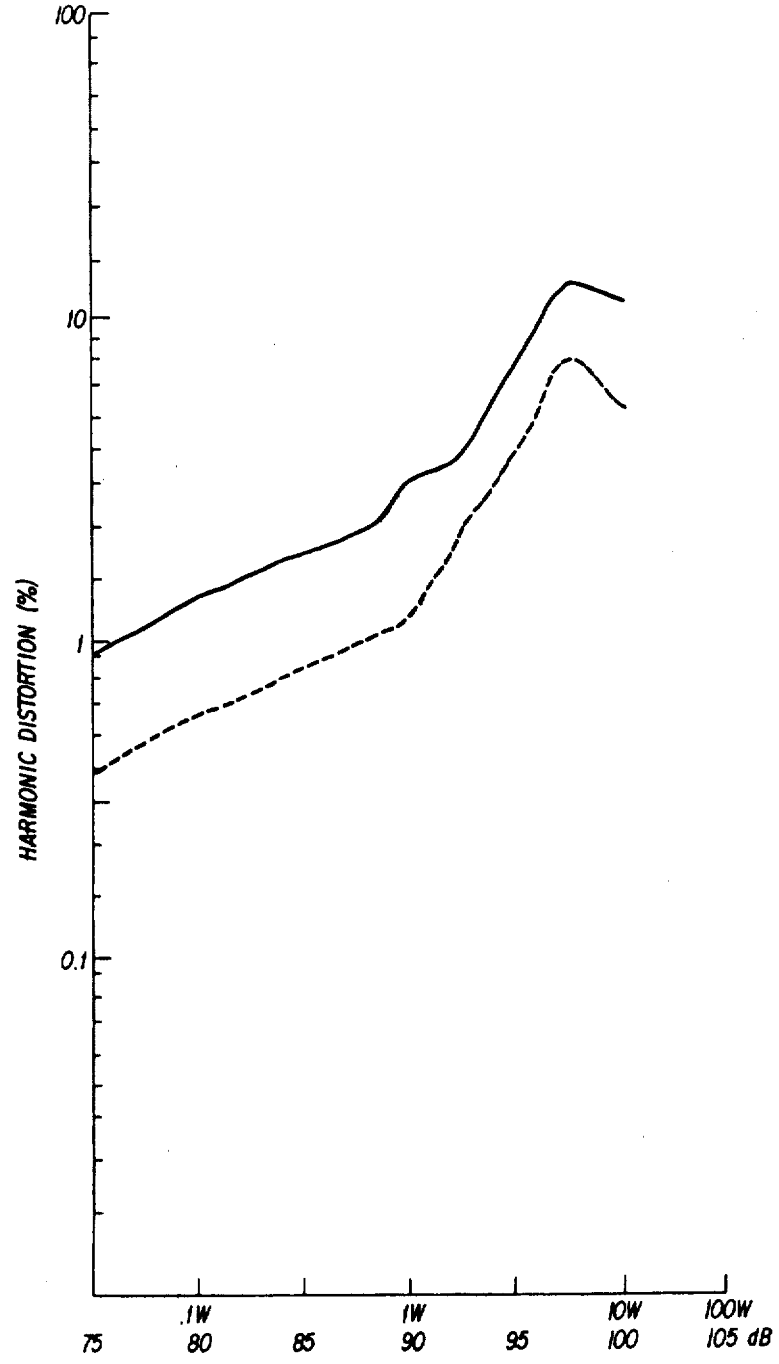
Figure 8A:
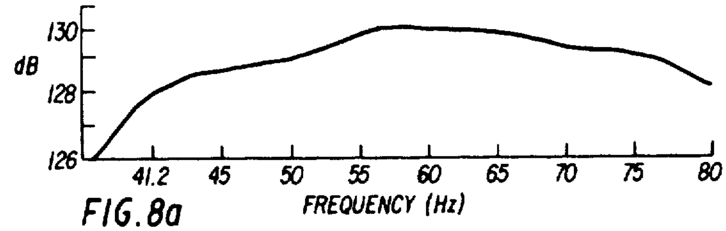
Figure 8B:
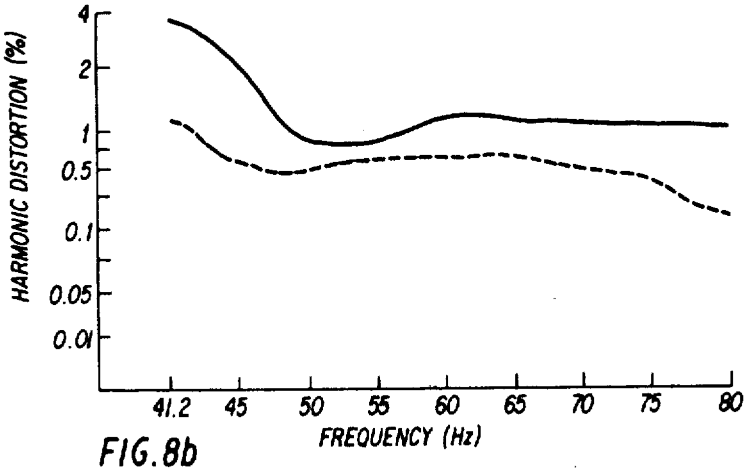
Figure 8C:
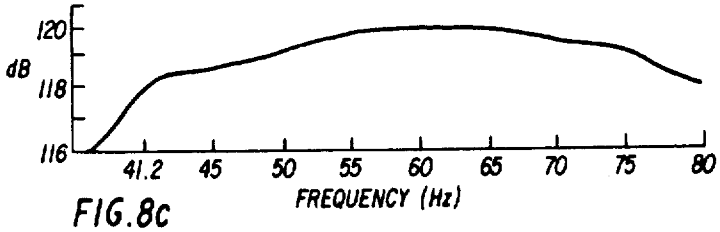
Figure 8D:
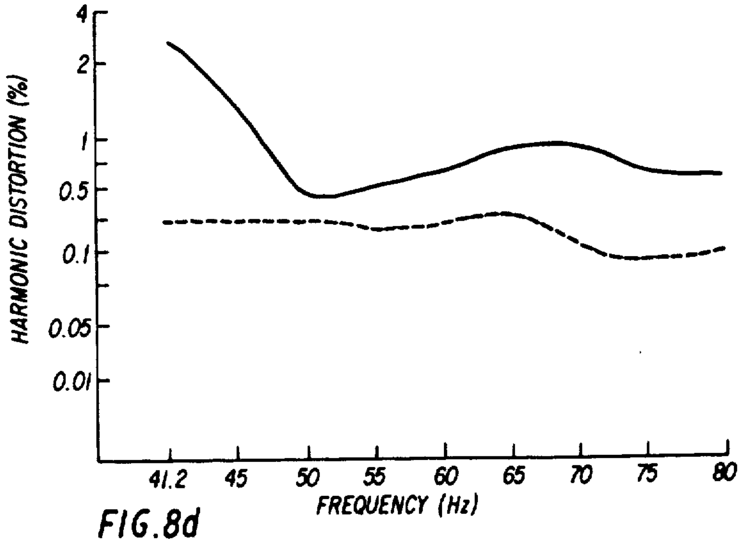
Figure 8E:
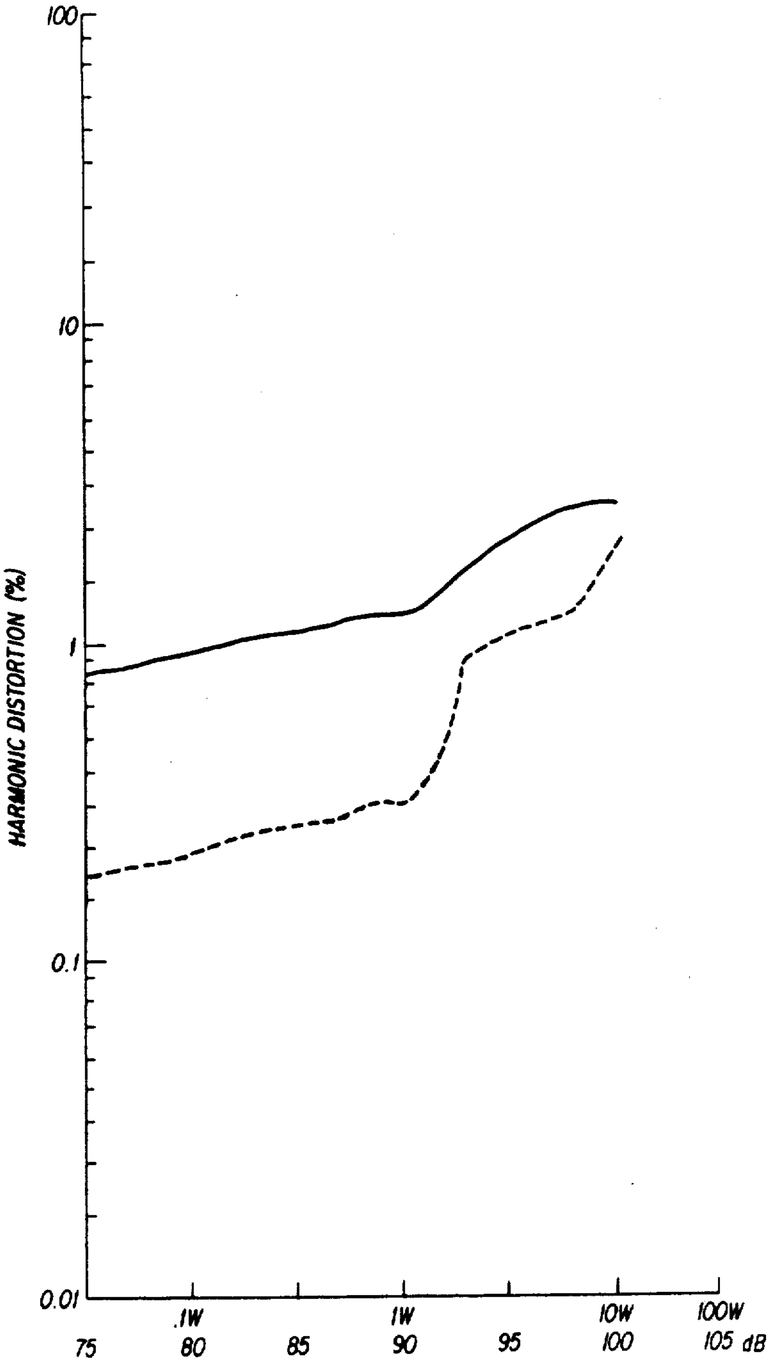
Figure 9A:
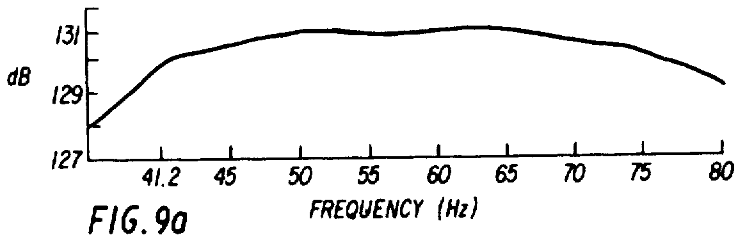
Figure 9B:
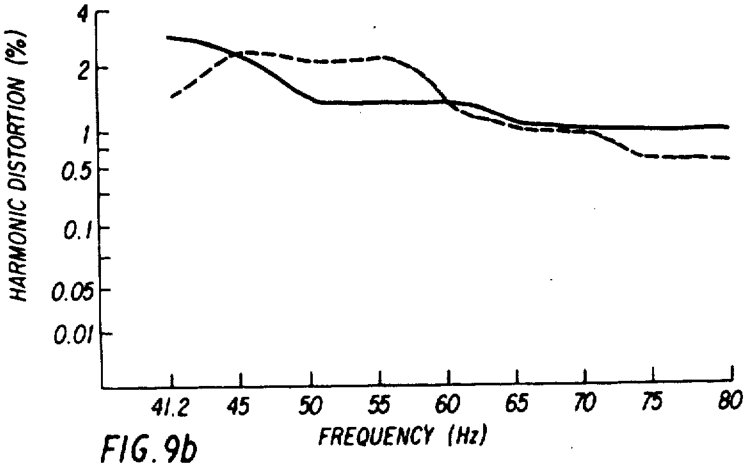
Figure 9C:
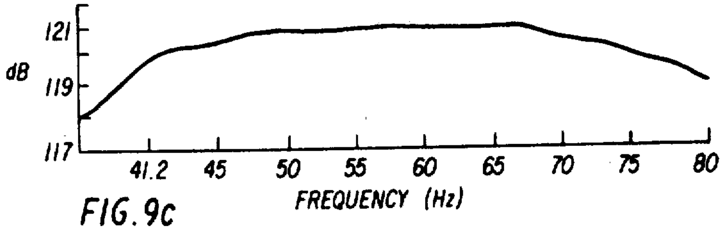
Figure 9D:
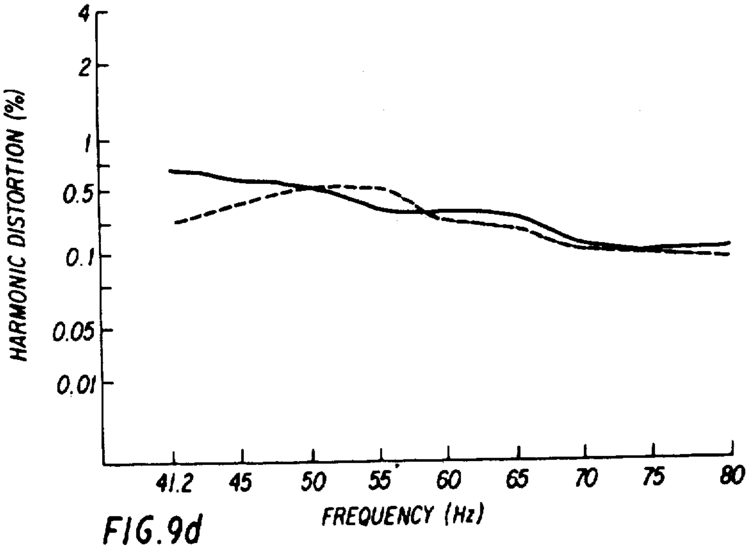
Figure 9E:
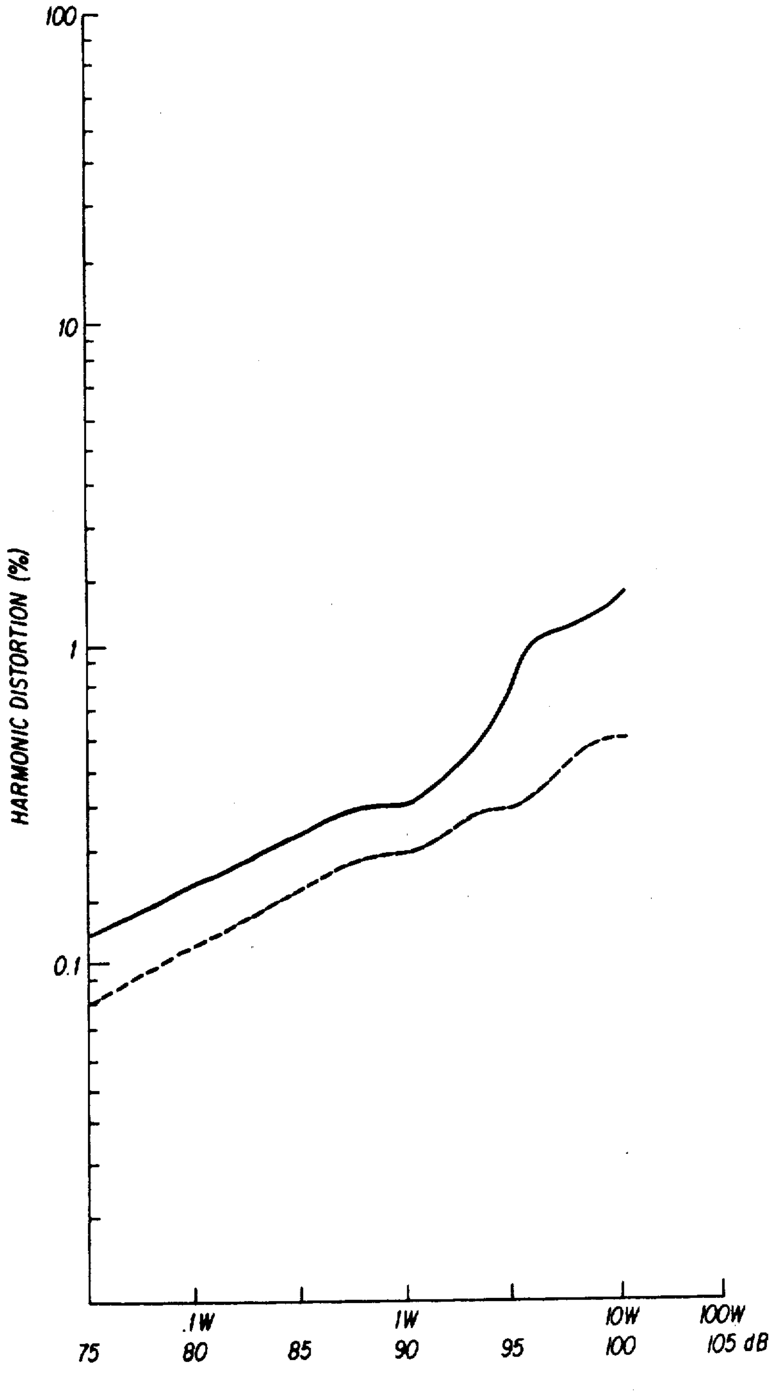
Figure 10A:
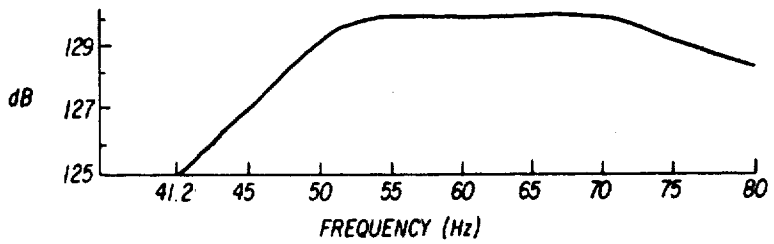
Figure 10B:
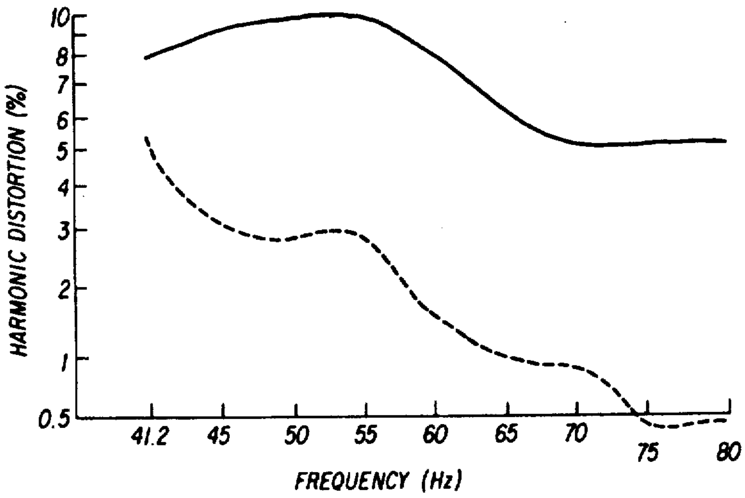
Figure 10C:
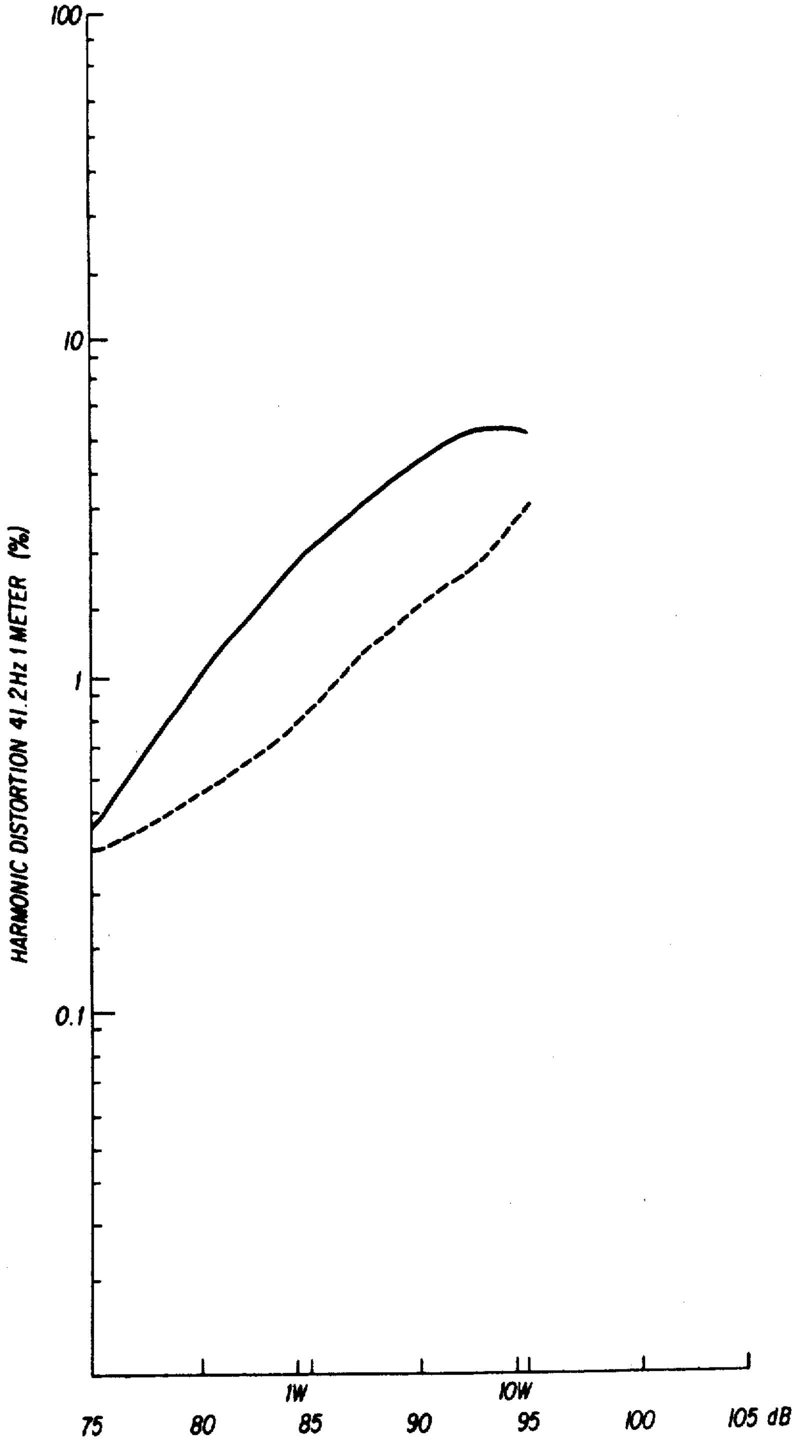

FIG. 7*a* and 7*b* are graphs representing the amount of harmonic distortion present in the sound generated by the transmission port of the old Model R enclosure between 41.2 and 80 cps at 128 decibels with approximately 15 Watts of input;

FIGS. 7*c* and 7*d* are graphs representing the amount of harmonic distortion present in the sound generated by the transmission port of the old Model R between 41.2 and 80 cps. at 118 decibels with approximately 1 watt of input;

FIG. 7*e* is a graph representing the amount of second and third harmonic distortion at 41.2 cps generated by the old Model R enclosure at a distance of one meter between a range of 75 to 100 decibels;

FIGS. 8*a* and 8*b* are graphs representing the amount of harmonic distortion present in the sound generated by the transmission port of one embodiment of the invention between 41.2 and 80 cps at 128 decibels with approximately 15 watts of input;

FIGS. 8*c* and 8*d* are graphs representing the amount of harmonic distortion present in the sound generated by the transmission port of one embodiment of the invention between 41.2 and 80 cps at 118 decibels with approximately 1 watt of input;

FIG. 8*e* is a graph representing the amount of harmonic distortion present in the sound generated by one embodiment of the enclosure at 41.2 cps at a distance of one meter between a range of 75 to 100 decibels;

FIGS. 9*a, b, c,* and d, and *e* are graphs which measure the same quantities as the graphs in FIGS. 8*a, b, c, d,* and *e* for another embodiment of the invention, and FIGS. 10*a, b* and *c* are graphs which measure the same quantities as the graphs in FIGS. 8*a, b* and *e* for still another embodiment of the invention.

DETAILED DESCRIPTION OF THE PREFERRED EMBODIMENTS

Figure 1:
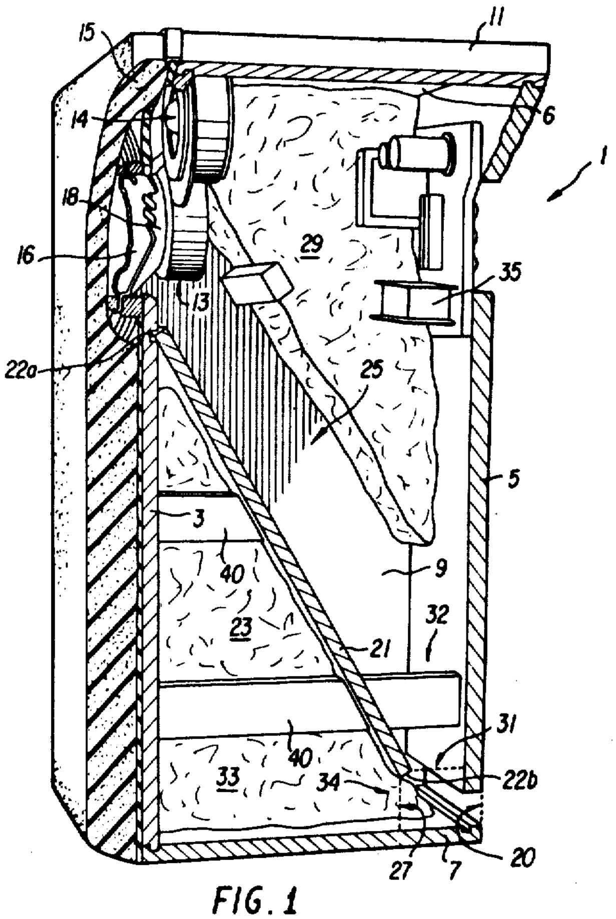
Figure 1A:
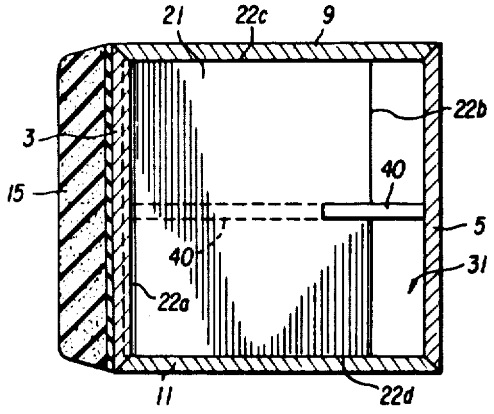

With reference now to FIGS. 1, 1*a*, 2*a*, *b*, 3, and 4, wherein like numerals represent like parts of the three preferred embodiments, the loudspeaker enclosure of the invention 1 generally comprises a rectangular cabinet having a front wall 3, a back wall 5, a top wall 6, a bottom wall 7, a side wall 9, and another side wall 11. Each of the walls 3,5, 6 7, 9 and 11 are preferably formed from fiberwood material in order to minimize cabinet resonance. Additionally, the FIG. 1, 1*a* embodiment preferably has a total internal cabinet volume of about 1.75 cubic feet, while the embodiments of FIGS. 2*a*, *b* and 3, 4 preferably have internal cabinet volumes of about 2.3 cubic feet and 0.5 cubic feet, respectively.

In each of the embodiments illustrated in FIGS. 1, 1*a* and 2*a*, *b*, the front wall 3 of the enclosure 1 includes a loudspeaker 13 which is an 8-inch woofer including a speaker cone 16 and cone carriage 18. Preferably, the woofer has a mechanical Q impedance factor of 3.8, an electrical impedance factor of 0.59, and a total Q factor of 0.51. Further, the woofer has a cone resonance frequency of between 60 and 70 cycles per second, and a rear piston radiating area x of 28 square inches, and an overall mass of 14.4 grams. Finally, the woofer has an electrical impedance ranging from 8.4 ohms to 55 ohms at the resonance frequency of the cone. The woofer used in the preferred embodiment is custom made by the Great American Industries Corp. in accordance with the aforementioned specifications, and has a cone resonance frequency of 66 cps.

Figure 3:
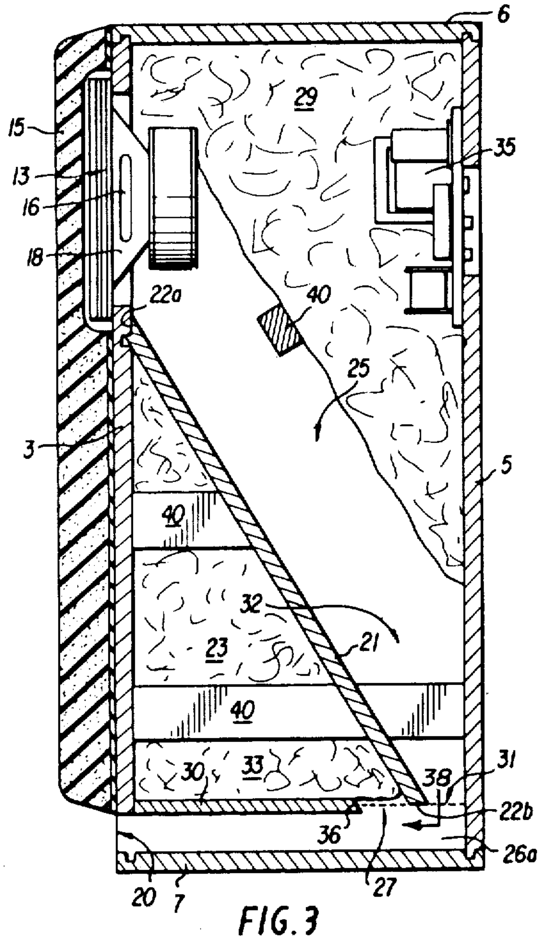
FIG. 3 is a side cross sectional view of still another preferred embodiment of the loudspeaker enclosure of the invention.
Figure 4:
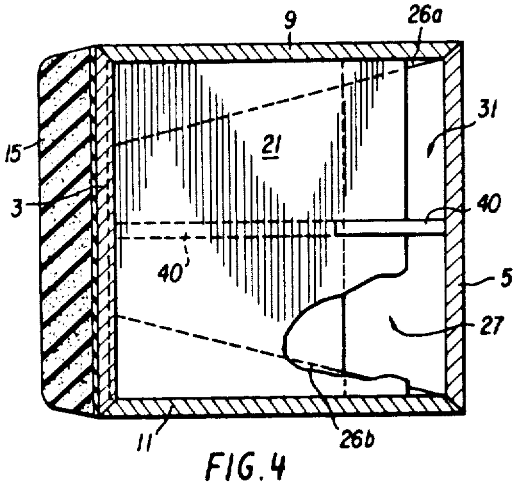
FIG. 4 is an elevational cross sectional view of the inside bottom portion of this preferred embodiment.

In the embodiment illustrated in FIGS. 3 and 4, the front wall 3 of the enclosure 1 includes a loudspeaker 13 which is preferably a 5 inch mid range speaker which includes a speaker cone 16 and cone carriage 18. In the preferred embodiment, the speaker has a total Q factor of 0.25, a cone resonance frequency of between 48 and 52 cycles per second, and a rear piston radiating area "x" of approximately 11 square inches. The brand name and model number of the five inch speaker used in the preferred embodiment of the invention is an Audax Model No. HIF13HSM, which has a cone resonance frequency of about 50 to 55 cycles per second. Applicant contemplates increasing the mechanical Q factor of this speaker to around 10 percent above its present level of 2.81 in order to reduce spurious cone excursions and maximize the efficiency of the enclosure over its bandwidth.

In the embodiment illustrated in FIG. 1, front wall 3 further includes a tweeter 14 which is preferably an Audax brand tweeter, model No. HD13D34H acoustically mounted in its upper right hand corner as shown. The resulting spatial configuration of the woofer 13 and tweeter 14 minimizes acoustical diffraction, and facilitates the generation of a clear acoustical image. In both the FIGS. 1, 1*a* and 2*a*, *b* embodiments, the tweeter 14 is recessed a couple inches from the outer edge of the woofer cone 16 in order to eliminate time phase distortion.

The front wall 3 in each of the three embodiments includes a sheet of foam baffling material 15 which is placed over the speakers 13,14 in the positions shown. Such front baffling material 15 minimizes front acoustical reverberation which can cause a slurring, heavy and unnatural tonal quality in the sound output generated by sound waves bouncing off the front baffle of the speakers 13,14.

Each of the three embodiments further includes a slotshaped transmission port 20 in its lower portion.

In the FIGS. 1, 1*a* and 2*a*, *b* embodiments, this transmission port 20 is formed by a rectangular gap between the back wall 5 and the bottom wall 7 of the enclosure 1. The cross sectional area "z" of the transmission port 20 should be between 30 and 65 percent of the rear piston radiating area of the woofer 13, which is approximately 28 square inches. The preferred cross sectional area of the transmission port 20 of the FIG. 1, 1*a*, embodiment is around 12.19 square inches, formed by a 1 1/16 inch gap between the 12-inch wide bottom wall 7 and back wall 5 of the enclosure. Further, the preferred cross sectional area of the transmission port 20 of the FIG. 2*a*, *b* embodiment is around 13.5 square inches, formed in the same manner by a 1⅛ inch gap.

In the FIG. 3 embodiment, the front wall 3 of the enclosure includes the transmission port 20, rather than the back wall 5. Preferably, the top and bottom edges of this transmission port 20 are formed by a rectangular gap between the bottom wall, respectively. Further, the sides of this transmission port are formed by the front edges of two triangular pieces of fiber wood 26*a* and *b* mounted between the bottom wall 7 of the enclosure and the bottom wall 30 of the tuned acoustical chamber 23 (see FIG. 4). Thus while the transmission port 20 of the FIG. 1, 1*a* and 2*a*, *b* embodiments extends the entire width of the bottom portion of back wall 5 of the enclosure, the transmission port 20 of the FIGS. 3 and 4 embodiment is only about half the width of the bottom of front wall 3 of the enclosure 1, and centrally disposed therein. The cross sectional area "z" of this front wall transmission port is preferably 5.7 square inches, formed from a rectangular gap between front wall 3 and bottom wall 7 1⅝" high by 3½" wide.

Each of the three embodiments illustrated in FIGS. 1, 1*a*, 2*a*, *b* and 3 also includes a partitioning means 21 diagonally mounted in the inside of the loudspeaker enclosure 1 as shown. The partitioning means 21 divides the interior of the enclosure 1 into a tuned acoustical chamber 23 and an air compression chamber 25. In the FIGS. 1, 1*a* and 3 preferred embodiments, the top edge 22*a* of the partitioning means 21 is sealingly mounted on the inside surface of the front wall 3 of the enclosure 1 about 1 inch below the bottom most portion of the speaker carriage 18. In the FIGS. 2*a*, *b* embodiment, the top edge 22*a* of the partitioning means 21 is mounted about an inch over the lip of the woofer cone carriage 18. In all three embodiments the side edges 22*c* and 22*d* of the partitioning means 21 are sealingly mounted onto the side walls 9 and 11 of the enclosure respectively, as shown in FIGS. 1*b* and 4. Bottom edge 22*b* of partitioning means 21 is not sealingly mounted on any of the enclosure walls 3, 5, 6, 7, 9, 11 and instead forms a horizontal gap 31 between it and the back wall 5, as well as a vertical gap 27 between it and the bottom wall 7. In the FIGS. 1*a*, *b*, 2*a*, *b*, embodiments, bottom edge 22*b* is at right angles to the top and bottom surfaces of partitioning means 21, as shown. In the FIG. 3 embodiment, bottom edge 22*b* is cut at approximately a 45 degree angle to the top and bottom surfaces of partitioning means 21, as shown. The significance of the gaps between bottom edge 22*b* and the bottom and back walls 5 and 7 of the enclosure 1 will be explained hereafter.

In all three embodiments, partitioning means 21 defines a tapered air compression chamber 25 between it, the side walls 9 and 11, and the inside surface of the back wall 5 of the enclosure. This air compression chamber 25 is acoustically coupled on its broadest end to the rear piston radiating area of the speaker cone 16. Further, air compression chamber 25 includes a triangular section of acoustical baffling material 29 (preferably fiberglass wool) which extends all the way across the upper portion of the corner formed by the back wall 5 and the top wall 6 of the enclosure 1. The purpose of this baffling material 29 is to stop midrange frequencies generated by the woofer 13 from reflecting off the portion of the back wall 5 which faces directly opposite the woofer cone 16. Such reflections could result in amplitude distortions were they not absorbed by baffling material 29.

In addition to the baffling material 29, the FIGS. 2a, b embodiment further includes an acoustical deflection plate 26 for deflecting sound waves generated by the rear piston radiating surface of woofer cone 16 down toward the lower portion of the compression chamber 25.

In all three embodiments, air compression chamber 25 includes a tapered end portion 32 which terminates in a throat 31. The purpose of the tapered end 32 of the compression chamber 25 is to concentrate and focus the pulsating column of air generated by the rear surface of the speaker cone 16 into compression chamber throat 31 and into an acoustical coupling 34 located at the bottom of the enclosure 1. The cross sectional area of the compression chamber throat 31 is preferably less than the rear piston radiating area of the woofer cone 16. This way, the chamber throat 31 places an additional load on the rear piston radiating area of the speaker cone 16.

Finally, in all three embodiments, a tuned acoustical chamber 23 is defined between the bottom surface of partitioning means 21, the inside surface of the back wall 5, and the side walls 9, 11 of the enclosure 1. The acoustical chamber is tuned to the system resonance frequency in each embodiment by making the perimeter around the triangular cross section of each correspond to a full wavelength of the second harmonic of the system resonance frequency of the entire volume of the enclosure.

In the FIGS. 1, 1a and 2a, b embodiments, the acoustical chamber 23 is preferably filled with four pieces of Owens Corning RA 26, three inch fiberglass wool baffling material 33. In the FIG. 3 embodiment, the acoustical chamber 23 is preferably filled with three pieces of three and one half inch Owens Corning RA 26 fiberglass wool baffling material. Since the width of the acoustical chamber 23 is about twelve inches in the FIGS. 1, 1a and FIGS. 2a, b embodiments, the four pieces of three inch RA 26 material uniformly fills the chamber 23 (when cut in the triangular shape of this chamber) without being compressed by the side walls 9 and 11 of the enclosure. However, in the FIG. 3 embodiment, the preferred width of the acoustical chamber is only six inches, and so the three pieces of three and one half inch RA 26 material is compressed by the side walls 9 and 11 of the enclosure. Thus the density of the baffling material 33 is greater in the FIG. 3 embodiment than in the FIGS. 1, 1a and 2a, b embodiments.

Figure 6:
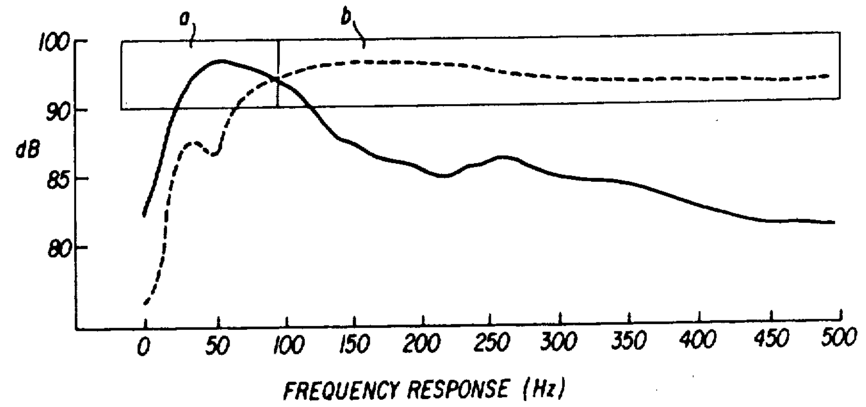
FIG. 6 is a graph of the decibel output over frequency of both the transmission port and the front radiating area of the woofer of the improved enclosure of the invention.

The function of baffling material 33 is to properly attentuate resonance peaks which would occur in the output of the enclosure 1 in the vicinity of the fundamental and harmonics of the system resonance frequency. Applicant has surprisingly found that if the aforementioned amounts of baffling material are inserted into the acoustical chamber 23 of each of the three embodiments, the chamber 23 efficiently functions as an in line, acoustical filter for the second and third harmonics of the system resonance frequency, as well as the fundamental. This phenomenon is illustrated in FIG. 6. Here, the dotted line represents the decibels of sound absorbed by the tuned acoustical chamber. The curve formed by this dotted line peaks in the vicinity of 60 cycles per second, which is the fundamental or first harmonic of the system resonance frequency. Note also how the tuned acoustical chamber continues to absorb sound at 120 and 180 cycles per second.

In the FIGS. 1, 1a and 2a, b embodiments, the bottom edge 22b of the partioning means 21 forms a gap with the bottom wall 7 of the enclosure 1 to form a rectangular sound entrance port 27 to the tuned acoustical chamber 23. In the FIG. 3 embodiment, the sound entrance port 27 to the tuned acoustical chamber 23 is formed by the bottom edge 22b of the partitioning means 21 and the edge 36 of the bottom wall 30 of the tuned acoustical chamber 23, as shown. Rather than being at right angles, edge 36 is preferably cut so that it is parallel to the bottom surface of the partioning means 21.

The cross sectional area "y" of the entrance port 27 of the acoustical chamber 23 varies between the three embodiments. In the FIGS. 1, 1a embodiment, this cross sectional area is preferably 23 square inches. In the FIGS. 2a, b embodiment, the cross sectional area of the sound entrance port 27 is preferably 21 square inches. In the FIG. 3 embodiment, this area is a little less than 11 square inches.

Each of the three embodiments also includes an acoustical coupling 34 for acoustically coupling together the compression chamber 25, the tuned acoustical chamber 23, and the transmission port 20 of enclosure 1.

In the FIGS. 1, 1a and 2a, b embodiments, acoustical coupling 34 is formed on its top side by the cross sectional area of the compression chamber throat 31, on its bottom side by the upper surface of bottom wall 7, on one side by back wall transmission port 20, and on the other side by the entrance port 27 of the tuned acoustical chamber 23. Thus acoustical coupling 34 forms an acoustical "T" intersection which splits the sound generated by the vibrating column of air moved by the rear piston radiating surface of woofer cone between the back enclosure transmission port 20 and the sound entrance port 27 of the tuned acoustical chamber 23.

In the FIG. 3 embodiment, acoustical coupling 34 includes an L shaped duct 38 formed on its bottom side by the orthogonal corner between the inside surface of the lower portion of the back enclosure wall 5, and the upper surface of the bottom enclosure wall 7, and its top side by the compression chamber throat 31, the bottom edge 22b of partitioning means 21, the entrance port 27 of the tuned acoustical chamber 23, and the bottom surface of the bottom acoustical chamber wall 30. The "L" shaped duct 38 of the acoustical coupling 34 conducts the vibrating column of air generated by the back of speaker cone 16 from compression chamber throat 31 to both the front enclosure wall transmission port 20, and the entrance port 27 of the tuned acoustical chamber 23.

Further, in order to minimize cabinet resonance, each of the three embodiments include a plurality of internal braces 40 which are preferably formed from the same fiberwood material as the cabinet walls 3, 5, 6, 7, 9 and 11. These braces 40 are preferably centrally located, as shown, and function both to keep the walls 3, 5, 6 and 7 from resonating as well as the partitioning means 21.

Finally, all embodiments include crossover circuits 35 for channeling most of the audio signals to either the woofer 13 or tweeter 14, depending on frequency. The schematic design of the crossover circuit 35 is conventional and not part of this invention and thus will not be discussed in detail. However, it should be noted that iron core inductors are preferred over air core inductors in this circuit 35 because they help maintain the high mechanical impedance desired in the driver or speaker unit 13 to a greater extent than air core inductors do. Iron core inductors require fewer numbers of coil windings to achieve the same inductance values as air core inductors. Fewer coil windings results in less electrical resistance (assumimg the same guage wire is used in both types of inductors) which allows a larger amount of current and hence power to flow therethrough. Thus the speaker unit 13 is electrically damped to a greater degree by crossover circuit 35 when such iron core inductors are used.

In operation, the rear piston radiating area of the speaker cone 16 and the compression chamber 25 cooperate in three ways to efficiently generate substantially distortionless sound. First, the mass of the column of air within compression chamber 25, in combination with the acoustical impedance generated by the smaller size of compression chamber throat 31 relative to the rear piston radiating area of woofer cone 16, places an air load on the back surface of woofer cone 16. This air load on the woofer cone 16 damps the movements of the cone and thereby eliminates or minimizes distortions which could occur due to "overhang" excursion of the cone 16. Secondly, the speaker cone 16 causes the column of air to vibrate like one large, sound generating piston extending the entire length of the air compression chamber. This, in turn, increases the efficiency of the speaker 13 in converting electrical energy into acoustical energy. Third, the tapered portion 32 of the air compression chamber 25 functions to uniformly concentrate and focus the air movement present in the vibrating column of air into the entrance of the T or L acoustical coupling of each of the embodiments.

The acoustical coupling 34 functions to effectively and uniformly couple all of the air vibrations generated by the rear piston radiating surface of the woofer cone 16 to both the tuned acoustical chamber 23 and the transmission port 20. Further, the improved design of the acoustical coupling 34 of the invention effectively balances the acoustical impedances exerted on the vibrating column of air in the compression chamber 25 by sound entrance port 27 and transmission port 20 so that the sound distorting amplitude peaks which would normally occur at the fundamental and second and third harmonics of the system resonance frequency are effectively flattened.

Thus, an acoustical transmission line is formed between the back surface of the speaker cone 16 and the transmission port 20.

When the back wall 5 of the FIGS. 1, 1*a* or 2*a*, *b* embodiments of the enclosure 1 is placed 10 inches or so from one of the walls of the room in which it sits, this transmission line is extended along the floor of the room by an acoustical structure formed by the back enclosure wall, the floor, and the room wall. The sound transmitted from the back wall transmission port bounces off the floor of the room and is transmitted out parallel to the back wall of the speaker enclosure and the room wall.

Similarly, when the back wall 5 of the FIG. 3 embodiment is placed either against a room wall or into a room corner, the transmission line between the back surface of the speaker cone and the transmission port 20 is extended along the floor of the room. In contrast to the FIGS. 1, 1*a* and FIGS. 2*a*, *b* embodiments, the sound radiated by the front wall transmission port 20 is transmitted in the same direction as the same direction as the sound radiated by the front surface of the speaker cone 16, and so serves to directly and constructively reinforce it.

Because the compression chamber throat 31 is always substantially equal to or smaller in area than the rear piston radiating area of the speaker cone 16, it is believed that the speaker enclosure 1 of the invention forms the equivalent of a hypex horn structure when used in combination with the walls and corners of a room. More specifically, applicant believes that the tapered compression compression chamber defines the throat of a hypex horn in each of the three embodiments, and that when the enclosure 1 is properly situated in a room, that the room floor and walls function as extensions of the enclosure and define the flair of the hypex horn. In the FIGS. 1 and 2 embodiments, the hypex flair is defined by the back enclosure wall 5, and the room floor and wall (not shown). In the FIG. 3 embodiment, applicant believes that this flare is defined by the front enclosure wall 3, and the room floor (not shown). If these embodiments do indeed operate according to this theory, then both the high efficiency, flat frequency response, and long bandwidth of the invention are accounted for in part. However, it should be noted that because the applicant does not fully understand exactly how his invention works, the applicant accordingly does not wish to be bound by either the aforementioned theorectical explanation, nor any other expressly stated or implied in this application.

Figure 5:
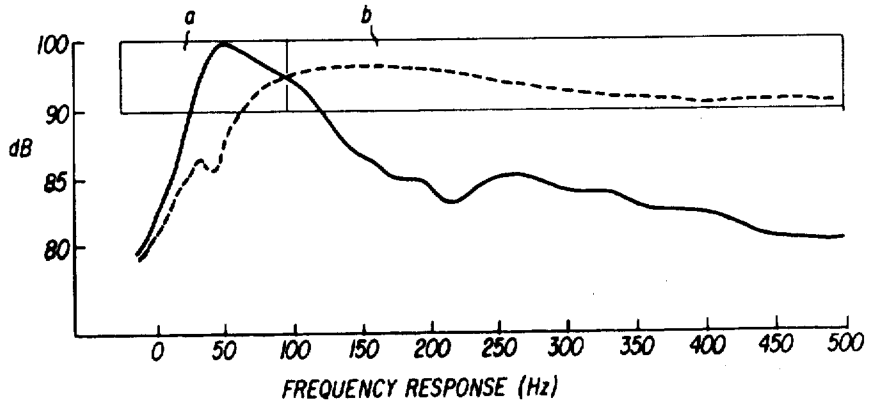
FIG. 5 is a graph of the decibel output over frequency of the transmission port and the front radiating area of the woofer of the old Model R enclosure.

FIGS. 5 and 6 illustrate the superior ability of the improved acoustical coupling 34 to flatten such sound distorting resonance peaks. FIG. 5 represents the acoustical output at one meter of the applicant's prior art Model R loudspeaker enclosure from 42 to 400 cps. at a constant power input of 1 watt. The solid line represents the output of the port; the dashed line represents the output of the speaker. FIG. 6 also represents the acoustical output at one meter of the FIG. 1 embodiment of the invention from 42 to 400 cps. at a constant power input of 1 watt. A comparison of section "a" of both graphs will disclose that the output of the invention is flatter in the vicinity of 50 cps. Likewise, a comparison of section "b" of the FIGS. 5 and 6 graphs will disclose that the acoustical output of the speaker enclosure of the invention is flatter between 100 and 500 cps.

FIGS. 7*a*, *b*, *c*, *d* and *e*, 8*a*, *b*, *c*, *d* and *e*, and 10*a*, *b* and *c* are graphs which represent a harmonic distortion analysis for both the old Model R enclosure and the FIGS. 1, 1*a* and 2*a*, *b* and 3 embodiments of the invention. Specifically, FIG. 7*a* represents the variations in decibel output of the back wall transmission port 20 over a range of between 41.2 and 80 cps. at a constant electrical power input. FIG. 7*b* represents the percent distortion in the output of transmission port 20 for both the second harmonic (solid line) and third harmonic (dashed line) of a broad range of bass frequencies (which includes the system resonance frequency). Similarly, FIG. 7*c* represents the variations in decibel output of the transmission port 20 over the same 41.2 to 80 cps. range at a constant electric power. Likewise, FIG. 7*d* represents the percent distortion in the output of transmission port 20 for both the second harmonic (solid line) and third harmonic (dashed line) of a broad range of bass frequencies which again includes the system resonance frequency.

Finally, FIG. 7*e* represents the distortion of the output at 1 meter attributable to the second harmonic (solid line) and third harmonic (dashed line) of 41.2 cps. ($E_1$ or low E of the bass which is a 27 foot long wavelength) with an input from between 0 to 15 watts.

The graphs illustrated in FIGS. 8a, b, c, d and e correspond to the graphs illustrated in FIGS. 7a, b, c, d and e, the difference being that the second and third harmonic measurements (represented by the solid and dashed lines, respectively) were made for the FIG. 1 embodiment of the invention.

Likewise the graphs illustrated in FIGS. 9a, b, c, d and e correspond to the graphs of FIGS. 7a, b, c, d and e, the difference being that the second and third harmonic measurements (represented by the solid and dashed lines, respectively) were made for the FIG. 2a, b embodiment of the invention. Finally, the graphs illustrated in FIGS. 10a, b and c correspond to the graphs of FIGS. 7a, b and c, the difference being that the second and third harmonic measurements (represented by the solid and dashed lines, respectively) were made for the FIG. 3 embodiment of the invention.

A comparison of FIGS. 7e, 8e, 9e and 10c will disclose that the sound generated by all three embodiments of the invention is accompanied by substantially less distortion than the sound generated by the applicant's old Model R enclosure, which is the closest prior art enclosure known of. More specifically, a comparison of the graphs in FIGS. 7e, 8e, and 9e will disclose that the FIGS. 1a, b embodiment of the invention produces only 31 percent of the harmonic distortion of that produced by the old Model R with no increase in enclosure volume, and that the FIG. 2a, b embodiment, with only a 31 percent increase in cabinet volume, produces only 11 percent of the distortion of the old Model R. Further, the FIG. 3 embodiment, with a 72 percent *decrease* in cabinet volume, still produces somewhat less distortion that the old Model R.

The absolute values of the harmonic distortion figures themselves become even more significant when related to the exceptionally high output of sound pressure levels at such low frequencies. Moreover, even with the significant range in enclosure volume from approximately 2.3 cubic feet to 0.497 cubic feet the conversion efficiency and the extension of low bass remains consistent and high when compared to prior art enclosures of equivalent volumes.

Having described my invention in such full, concise and clear terms to allow a person of ordinary skill in the speaker art to make and use the same, I claim:

1. An improved loudspeaker enclosure for generating sound radiation in a room having a floor and a wall comprising;

a. a loudspeaker acoustically mounted therein for generating sound radiation, said loudspeaker having a rear piston radiating area of x;

b. a wall including a sound transmission port having a cross sectional area of between .3x and .65x for forming a sound radiation structure in combination with the room floor and room wall;

c. a bottom wall;

d. a tuned acoustical chamber for selectively absorbing sound radiation of the fundamental and even and odd harmonics of the system resonance frequency of the enclosure, said acoustical chamber including a sound radiation entrance port having a cross sectional area of y;

e. a compression chamber which is acoustically coupled to said rear piston radiation area of said loudspeaker, said chamber having a throat having a cross sectional area substantially equal to or less than x, and f. an acoustical coupling for coupling said compression chamber throat with said sound transmission port and said sound radiation entrance port of said tuned acoustical chamber, said coupling having a top including said compression chamber throat, a bottom including said bottom enclosure wall, and a side including said transmission port.

2. The improved loudspeaker enclosure of claim 1 wherein the said acoustical coupling has another side including said sound radiation entrance port of said acoustical chamber.

3. The improved loudspeaker enclosure of claim 1 wherein said tuned acoustical chamber includes a bottom wall, and said top of said acoustical coupling further includes said bottom wall of said acoustical chamber, and said sound radiation entrance port of said acoustical chamber.

4. The improved loudspeaker enclosure of claim 2 further including a partitioning means for partitioning the interior of said enclosure into said tuned acoustical chamber and said compression chamber.

5. The improved loudspeaker enclosure of claim 3 further including a partitioning means for partitioning the interior of said enclosure into said tuned acoustical chamber and said compression chamber.

6. An improved loudspeaker enclosure for generating sound radiation, comprising:

(a) a front wall including a loudspeaker acoustically mounted therein and a sound transmission port, said loudspeaker having a rear piston radiating area of x, and said transmission port having a cross sectional area of between .3x and .65x;

(b) a back wall;

(c) a bottom wall;

(c) a tuned acoustical chamber for selectively absorbing sound radiation of the fundamental and even and odd harmonics of the system resonance frequency of the enclosure, said acoustical chamber including a bottom wall and a sound radiation entrance port having a cross sectional area equal to or less than x;

(d) a compression chamber which is acoustically coupled to said rear piston radiating area of said loudspeaker for placing an acoustical load on said rear piston radiating area of said loudspeaker, said chamber terminating in a throat having a cross sectional area substantially equal to or less than x, and (f) an acoustical coupling for coupling said compression chamber with said front wall transmission port and said sound radiation entrance port of said tuned acoustical chamber, said coupling including a duct formed on its bottom by the lower portion of said back wall and said bottom wall, and formed on its top by said chamber throat, said sound radiation entrance port of said tuned acoustical chamber, and said acoustical chamber bottom wall.

7. An improved loudspeaker enclosure for generating sound radiation in a room having a floor and a wall, comprising:

(a) a top wall, a bottom wall, and a pair of side walls;

(b) a front wall including a loudspeaker acoustically mounted therein for generating sound radiation, said loudspeaker having a rear piston radiating area of x;

(c) a back wall substantially parallel to said front wall and including a sound transmission port having a cross sectional area between .3x and .65x for forming a sound radiation structure in combination with the room floor and room wall when said back wall faces said room wall;

(d) a partitioning means having a top edge acoustically sealed to the inner surface of said front wall under said loudspeaker, two opposing side edges, each of which is acoustically sealed to one of the inner surfaces of said side walls, and a bottom edge which is spaced away from the inner surface of said bottom wall;

(e) a tuned acoustical chamber defined between said front wall, said side walls, and said partitioning means for selectively absorbing sound radiation of the fundamental and even and odd harmonics of the system resonance frequency of the enclosure, said acoustical chamber including a sound radiation entrance port having a cross sectional area less than x defined between said bottom edge of said partitioning means and said bottom wall;

(f) an air compression chamber defined between said back wall, said side wall, and said partitioning means, said compression chamber having an upper portion which is acoustically coupled to said rear piston radiating area of said loudspeaker, and a lower portion terminating in a throat having a cross sectional area less than x which is acoustically coupled both to said back wall transmission port and to said entrance port of said tuned acoustical chamber, and (g) an acoustical coupling means formed by said compression chamber throat, said sound radiation entrance port of said tuned acoustical chamber, and said back wall transmission port for coupling said compression chamber with said acoustical chamber and said back wall transmission port.

8. The improved loudspeaker enclosure of claim 7 wherein said tuned acoustical chamber includes damping material for damping sound radiation entering said sound radiation entrance port.

9. The improved loudspeaker enclosure of claim 8 further including a bracing means for bracing said partitioning means within said enclosure.

10. A loudspeaker enclosure for generating sound radiation in a room having a floor and a wall of the type including:

(a) a front wall including a loudspeaker acoustically mounted therein for generating sound radiation, said loudspeaker having a rear piston radiating area of x;

(b) a back wall including a sound transmission port of cross sectional area z for forming a sound radiation structure in combination with the room floor and room wall when said back wall faces said room wall;

(c) a tuned acoustical chamber for selectively absorbing the fundamental and even and odd harmonics of the system resonance frequency of the enclosure, said acoustical chamber including a sound radiation entrance port of cross sectional area y, and (d) an air compression chamber which is acoustically coupled to said rear piston radiating area of said loudspeaker, said compression chamber including a throat having a cross sectional area of less than x which is acoustically coupled both to said back wall transmission port of said enclosure and to said entrance port of said tuned acoustical chamber, the improvement comprising selecting a back wall transmission port with a cross sectional area of between 30 and 65 percent of said rear piston radiating area of said loudspeaker.

11. The loudspeaker enclosure of claim 10, wherein said enclosure is further of the type including both a partitioning means for partitioning the interior of said enclosure into said tuned acoustical chamber and said air compression chamber, and a pair of opposing side walls, wherein said partitioning means has a top edge acoustically sealed to the inner surface of said front wall under said loudspeaker and two opposing side edges acoustically sealed to the inner surfaces of said side walls, and a bottom edge which is spaced away from the inner surface of said bottom wall, whereby said air compression chamber is defined between said partitioning means and the inner surface of said back wall of said enclosure, and wherein said front and back walls are substantially parallel, and wherein said improvement further includes a sound radiation deflector plate for deflecting sound radiation generated by said diaphragm of said loudspeaker away from the inner surface of said back wall and toward said sound radiation port of said compression chamber.

12. An improved loudspeaker enclosure having between 1.5 and 2.5 cubic feet of air volume for generating sound radiation in a room having a floor and a wall, comprising:

(a) a front wall including a loudspeaker acoustically mounted therein for generating sound radiation, said loudspeaker having a rear piston radiating area of about 28 square inches;

(b) a back wall including a sound transmission port having a cross sectional area between 12 and 14 square inches for forming a sound radiation structure in combination with the room floor and room wall when said back wall faces said room wall;

(c) a tuned acoustical chamber for selectively absorbing sound radiation of the fundamental and second and third harmonic resonance frequencies of the enclosure, said acoustical chamber including a sound radiation entrance port having a cross sectional area between 20.5 and 23.5 square inches;

(d) a compression chamber which is acoustically coupled to said rear piston radiating area of said loudspeaker diaphragm, said compression chamber terminating in a throat having a cross sectional area of less than 28 square inches, and (e) an acoustical coupling for acoustically coupling said compression chamber throat both to said back wall transmission port of said enclosure and to said entrance port of said tuned acoustical chamber.

13. The improved loudspeaker enclosure of claim 12 wherein said enclosure has a volume of about 1.75 cubic feet, and said loudspeaker has a Q value of about 0.51, and said transmission port has a cross sectional area of about 12.20 square inches, and said second radiation entrance port has a cross sectional area of about 23.5 square inches, and said compression chamber throat has a cross sectional area of about 20.12 square inches.

14. The improved loudspeaker enclosure of claim 12 wherein said enclosure has a volume of about 2.14 cubic feet, and said loudspeaker has a Q value of about 0.51, and said transmission port has a cross sectional area of about 13.5 square inches and said acoustical chamber throat has a cross sectional area of about 21 square inches.

15. The improved loudspeaker enclosure of claim 12 further including a bottom wall, and wherein said sound transmission port of said back enclosure wall is partially defined by said bottom enclosure wall.

16. The improved loudspeaker enclosure of claim 15 further including a partitioning means for partitioning the interior of said enclosure into said tuned acoustical chamber and said air compression chamber.

17. The improved loudspeaker enclosure of claim 16 further including a pair of opposing side walls, and wherein said partitioning means has a top edge acoustically sealed to the inner surface of said front wall under said loudspeaker, and two opposing side edges acoustically sealed to said side walls.

18. A loudspeaker enclosure containing between 0.4 and 0.6 cubic feet of air for generating sound radiation, comprising:

(a) a front wall including a loudspeaker acoustically mounted therein for generating sound radiation and a sound transmission port, said loudspeaker having a rear piston radiating area of between 10 and 12 square inches, and said transmission port having a cross sectional area between 30 and 65 percent of said rear piston radiating area;

(b) a back wall;

(c) a tuned acoustical chamber for selectively absorbing sound radiation of the fundamental and second and third harmonic resonance frequencies of the enclosure, said acoustical chamber including a sound radiation entrance port having a cross sectional area between 10 and 12 square inches;

(d) a compression chamber which is acoustically coupled to said rear piston radiating area of said loudspeaker cone, said compression chamber terminating in a throat having a cross sectional area less than the rear piston radiating area of said loudspeaker, and (e) an acoustical coupling for acoustically coupling said loading chamber with said transmission port and said tuned acoustical chamber, said coupling including a duct formed on its bottom by the lower portion of said back wall and said bottom wall and formed on its top by said loading chamber throat, said sound radiation entrance port of said tuned acoustical chamber, and said acoustical chamber bottom wall.

19. The improved loudspeaker enclosure of claim 18 wherein said enclosure has a volume of about 0.5 cubic feet, and said loudspeaker has a rear piston radiating area of 11 square inches and a Q value of about 0.25 and said transmission port has an area of about 5.7 square inches, and said acoustical chamber has a sound radiation entrance port of between 9 and 10.9 square inches, and said loading chamber has a throat having a cross sectional area of between 9 and 10.9 square inches.

20. The improved loudspeaker enclosure of claim 19 further including a bottom wall, and wherein said sound transmission port of said back enclosure wall is partially defined by said bottom enclosure wall.

21. The improved loudspeaker enclosure of claim 20 further including a partitioning means for partitioning the interior of said enclosure into said tuned acoustical chamber and said air compression chamber.

22. The improved loudspeaker enclosure of claim 21 further including a pair of opposing side walls, and wherein said partitioning means has a top edge acoustically sealed to the inner surface of said front wall under said loudspeaker, and two opposing side edges acoustically sealed to the inner surfaces of said side walls, and a bottom edge which is spaced away from the inner surface of said bottom wall.

23. The improved loudspeaker enclosure of claim 22 wherein said tuned acoustical chamber is defined between said partitioning means and said inner surface of said front and side enclosure walls, and said acoustical chamber bottom wall, and said sound radiation entrance port is defined between said bottom edge of said partitioning means and bottom acoustical chamber wall.

24. The improved loudspeaker enclosure of claim 23 wherein said compression chamber is defined between said partitioning means, and the inner surfaces of said back and side enclosure walls, and said chamber throat is defined between said bottom edge of said partitioning means and said inner surface of said back wall.

25. A process for transmitting sound radiation into a room having a floor and a wall from a loudspeaker cone mounted in the front wall of an enclosure including a compression chamber, a tuned acoustical chamber and a sound transmission port having a cross sectional area of between 30 and 65 percent of the rear piston radiating area of said cone, comprising the steps of:

(a) vibrating said cone to generate sound radiation from both the front and back sides of said cone;

(b) capturing said radiation emanating from said back side of said cone into said compression chamber;

(c) transmitting sound radiation out of said compression chamber and into an acoustical coupling which acoustically couples said compression chamber with said tuned acoustical chamber and said transmission port, and (d) transmitting said sound radiation out of said transmission port along said room floor.

26. The process of claim 25 wherein said compression chamber includes a throat, and said turned acoustical chamber includes a sound entrance port and wherein said acoustical coupling is formed by a junction between said throat, said sound entrance port, and said front wall transmission port.

27. A process for transmitting sound radiation from a loudspeaker cone mounted in the front wall of an enclosure having a front wall transmission port, a back wall, a tuned acoustical chamber including a sound entrance port and a bottom wall, and a compression chamber including a throat, comprising the steps of:

(a) vibrating said cone to generate sound radiation from both the front and back sides of said cone;

(b) capturing said radiation emanating from said back side of said cone into said throat of said compression chamber;

(c) transmitting sound radiation out of said throat of said compression chamber into an acoustical coupling including a duct formed on its bottom by said back and bottom enclosure walls, and on its top by said chamber throat and said acoustical chamber sound entrance port wherein said acoustical coupling couples together said compression chamber, said tuned acoustical chamber and said front wall transmission port, and (d) transmitting said sound radiation out of said front wall transmission port and said front side of said loudspeaker cone.

* * * * *